United States Patent
Tsai et al.

(10) Patent No.: US 8,963,296 B2
(45) Date of Patent: Feb. 24, 2015

(54) DOUBLE TRENCH RECTIFIER

(71) Applicants: Hung-Ping Tsai, Zhonghe (TW);
Shih-Kuan Chen, Yung-He (TW);
Lung-Ching Kao, Taipei (TW)

(72) Inventors: Hung-Ping Tsai, Zhonghe (TW);
Shih-Kuan Chen, Yung-He (TW);
Lung-Ching Kao, Taipei (TW)

(73) Assignee: Vishay General Semiconductor, LLC, Columbus, NE (US)

( * ) Notice: Subject to any disclaimer, the term of this patent is extended or adjusted under 35 U.S.C. 154(b) by 0 days.

(21) Appl. No.: 14/169,814

(22) Filed: Jan. 31, 2014

(65) Prior Publication Data

US 2014/0217561 A1 Aug. 7, 2014

Related U.S. Application Data

(63) Continuation of application No. 13/406,071, filed on Feb. 27, 2012, now Pat. No. 8,643,152, which is a continuation of application No. 12/565,201, filed on Sep. 23, 2009, now Pat. No. 8,125,056.

(51) Int. Cl.
| | |
|---|---|
| *H01L 29/06* | (2006.01) |
| *H01L 21/04* | (2006.01) |
| *H01L 29/66* | (2006.01) |
| *H01L 29/861* | (2006.01) |
| *H01L 29/868* | (2006.01) |

(52) U.S. Cl.
CPC ........ *H01L 29/6609* (2013.01); *H01L 29/0657* (2013.01); *H01L 29/66136* (2013.01); *H01L 29/861* (2013.01); *H01L 29/868* (2013.01)
USPC .......................................... 257/653; 438/510

(58) Field of Classification Search
CPC . H01L 29/6609; H01L 29/868; H01L 29/861; H01L 29/66136; H01L 29/0657
USPC ................... 257/653, 654; 438/510, 595, 923
See application file for complete search history.

(56) References Cited

U.S. PATENT DOCUMENTS

| | | |
|---|---|---|
| 3,553,536 A | 1/1971 | Neilson |
| 4,524,376 A | 6/1985 | Cornick |
| 4,835,580 A | 5/1989 | Havemann et al. |
| 5,047,829 A | 9/1991 | Seymour et al. |
| 5,241,195 A | 8/1993 | Tu et al. |
| 6,624,493 B1 | 9/2003 | Welch |
| 7,489,488 B2 | 2/2009 | Vos et al. |
| 2006/0138450 A1 | 6/2006 | Lanois et al. |
| 2008/0128850 A1 | 6/2008 | Goerlach et al. |
| 2010/0025809 A1 | 2/2010 | Bowman |

FOREIGN PATENT DOCUMENTS

EP 0 046 316 A1 2/1982

*Primary Examiner* — Nikolay Yushin
(74) *Attorney, Agent, or Firm* — Volpe and Koenig, P.C.

(57) ABSTRACT

A high power density or low forward voltage rectifier which utilizes at least one trench in both the anode and cathode. The trenches are formed in opposing surfaces of the substrate, to increase the junction surface area per unit surface area of the semiconductor die. This structure allows for increased current loads without increased horizontal die space. The increased current handling capability allows for the rectifier to operate at lower forward voltages. Furthermore, the present structure provides for increased substrate usage by up to 30 percent.

22 Claims, 5 Drawing Sheets

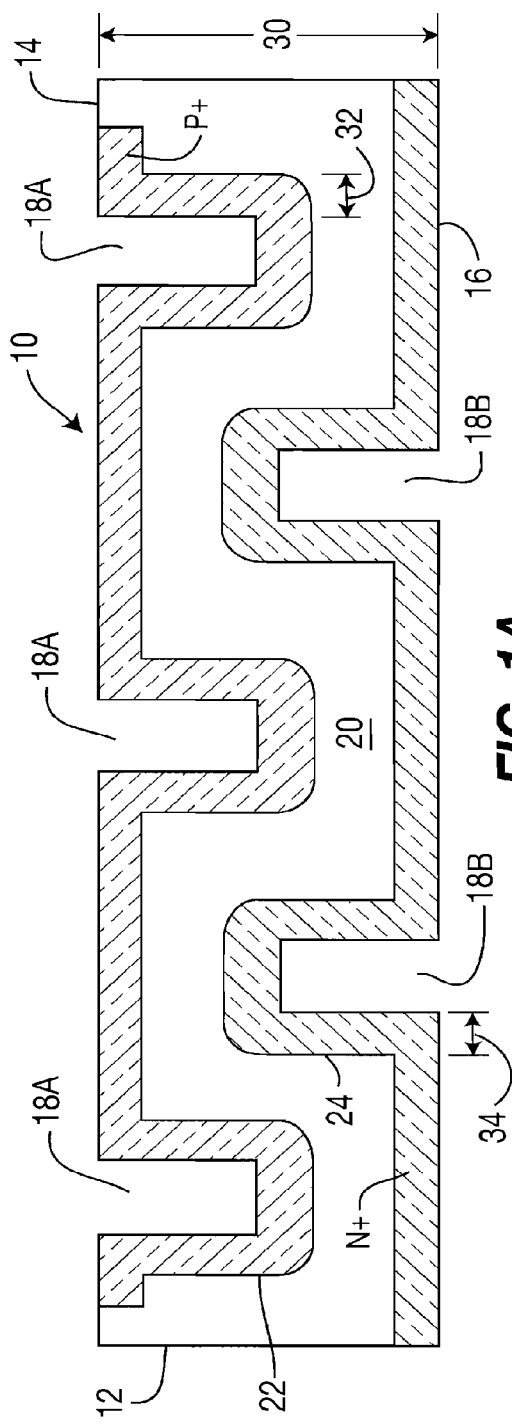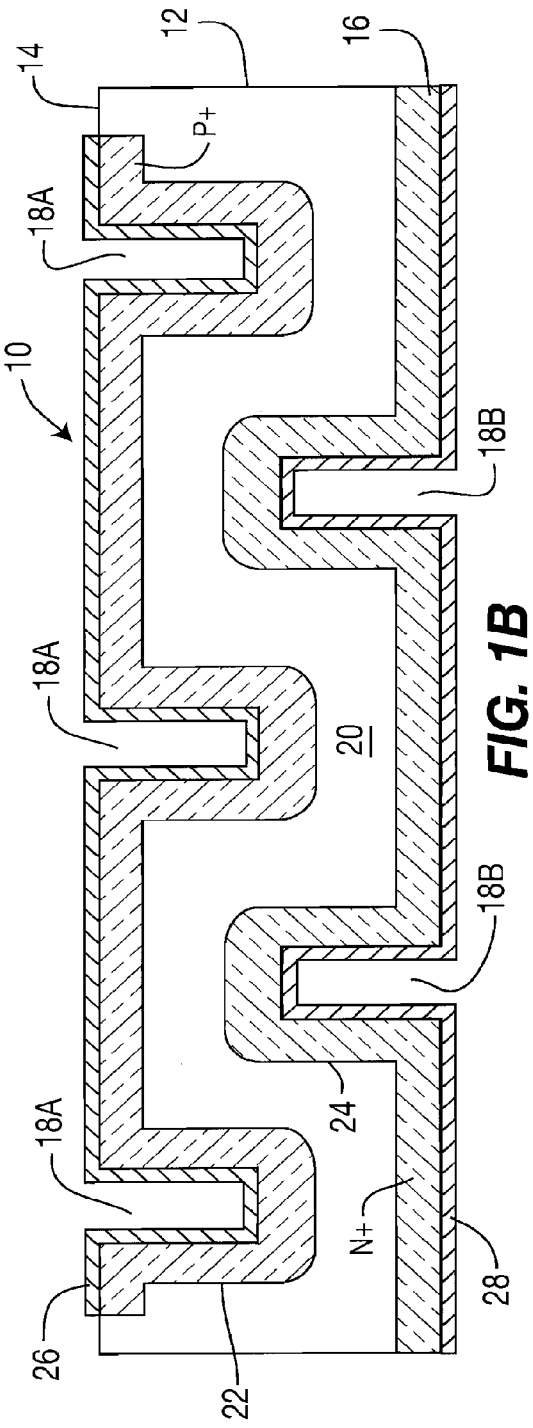

| DOUBLE TRENCH RECTIFIER | | NORMAL 2 D JUNCTION (PLANAR OR GPP) | | IMPROVE RATIO |
|---|---|---|---|---|
| CURRENT DENSITY/um | VF | CURRENT DENSITY/um | VF | |
| -8.119E-15 | 0.1 | -5.337E-16 | 0.1 | 15.21 |
| -1.198E-13 | 0.2 | -2.554E-14 | 0.2 | 4.69 |
| -3.316E-12 | 0.3 | -1.198E-12 | 0.3 | 2.77 |
| -1.267E-10 | 0.4 | -5.509E-11 | 0.4 | 2.30 |
| -4.286E-09 | 0.5 | -2.006E-09 | 0.5 | 2.14 |
| -1.336E-07 | 0.6 | -6.784E-08 | 0.6 | 1.97 |
| -4.875E-06 | 0.7 | -2.614E-06 | 0.7 | 1.86 |
| -1.142E-04 | 0.8 | -6.830E-05 | 0.8 | 1.67 |
| -8.185E-04 | 0.9 | -5.284E-04 | 0.9 | 1.55 |
| -2.551E-03 | 1 | -1.690E-03 | 1 | 1.51 |
| -5.377E-03 | 1.1 | -3.598E-03 | 1.1 | 1.49 |
| -9.236E-03 | 1.2 | -6.216E-03 | 1.2 | 1.49 |
| -1.402E-02 | 1.3 | -9.478E-03 | 1.3 | 1.48 |
| -1.961E-02 | 1.4 | -1.331E-02 | 1.4 | 1.47 |
| -2.588E-02 | 1.5 | -1.762E-02 | 1.5 | 1.47 |
| -3.269E-02 | 1.6 | -2.234E-02 | 1.6 | 1.46 |
| -3.995E-02 | 1.7 | -2.739E-02 | 1.7 | 1.46 |
| -4.755E-02 | 1.8 | -3.270E-02 | 1.8 | 1.45 |
| -5.543E-02 | 1.9 | -3.822E-02 | 1.9 | 1.45 |
| -6.350E-02 | 2 | -4.391E-02 | 2 | 1.45 |

*FIG. 7*

DOUBLE TRENCH RECTIFIER

CROSS REFERENCE TO RELATED APPLICATIONS

This application is a continuation of U.S. patent application Ser. No. 13/406,071, filed Feb. 27, 2012, issuing as U.S. Pat. No. 8,643,152 on Feb. 4, 2014, which is a continuation of U.S. patent application Ser. No. 12/565,201, filed Sep. 23, 2009, now U.S. Pat. No. 8,025,056 issued Feb. 28, 2012, which are all incorporated by reference as if fully set forth herein.

FIELD OF INVENTION

The present invention relates to rectifiers. More specifically, the present invention relates to low forward voltage or high power density rectifiers.

BACKGROUND

Traditional rectifiers generally comprise one or more discrete diodes. These discrete diodes have a junction between materials with specifically designed electrical properties such that at the junction of the materials current can only pass in one direction. The amount of current these diodes are able to pass is proportional to the surface area of this junction.

These diodes are often formed in a semiconductor substrate, sometimes called a die. The die is doped with various materials which augment the electrical properties of various portions of the die in order to form the junction. These doping materials are generally communicated to the die directly through its surface. The less surface area a diode takes up on the die, the more diodes can fit on a die, the higher the semiconductor die usage efficiency. It is beneficial to maintain high usage efficiency in order to lower costs; however, it is beneficial to maintain a large junction surface area in order to communicate more current. This creates a need to balance the demand to handle higher current loads with the increased cost of being able to accommodate fewer diodes on the die.

Traditional diodes have a two dimensional junction surface area. This design is not optimal to maximize the junction surface area while minimizing the area occupied by the diode on the surface of the die. What is needed is a more efficient diode.

Once aspect of the embodiments disclosed herein is to improve over the state of the art.

Another aspect is to provide a three dimensional junction surface area which enables increased junction surface area relative to two dimensional junction diodes of similar size.

Another aspect is that with a greater junction surface area the rectifier is able to pass more current than a two dimensional structure of similar size.

Yet another aspect is that because of its ability to pass higher current levels, it can operate at a lower forward voltage which results in energy savings.

A further aspect is that because the junction surface area is increased without increasing the space occupied by the rectifier on the substrate surface, there is increased usage efficiency of the semiconductor substrate which results in cost savings.

One or more of these aspects will become apparent from the specification and claims that follow.

SUMMARY

The market for electronic component devices, such as rectifiers, has an ever increasing need for devices that take up less space, can handle higher current loads, can operate on less power, and are cost effective. Mobile devices in particular are especially concerned with space and power constraints. Therefore there is a high demand for devices which are smaller, more powerful and operate on less power, while generally not increasing in cost. The embodiments disclosed herein are an improvement over prior art which is designed to meet these needs.

The embodiments disclosed herein are directed towards high power density or low forward voltage rectifiers. A key feature is the utilization of trenches to create three dimensional junctions which have an increased junction surface area compared to traditional two dimensional junction rectifiers with comparable size. The amount of current that can be passed through a rectifier is proportional to the surface area of the rectifier junction and therefore the present embodiment can handle higher current levels than two dimensional junction rectifiers of comparable size.

The embodiments disclosed herein create a three dimensional junction by forming a trench in the semiconductor which vertically penetrates the surface of the semiconductor. This trench does not take up any more horizontal space on the surface of the semiconductor die than its two dimensional counterpart. This provides for an increased semiconductor usage efficiency over prior art. This increased semiconductor usage can be as high as 30%.

The embodiments disclosed herein are able to handle higher current densities at various forward voltages than comparable two dimensional junction diodes, and therefore can handle the same current loads at lower applied voltages. This allows the embodiments disclosed herein to operate at lower voltage and thereby save power. In mobile devices this is especially advantageous because less power usage results in extended battery life.

BRIEF DESCRIPTION OF THE DRAWINGS

FIG. 1A is a diagram of an embodiment of a double trench rectifier structure.

FIG. 1B is a diagram of an embodiment of a double trench rectifier structure including a metal layer.

FIG. 7 is a chart comparing the current densities of the double trench rectifier structure of FIG. 1A to that of a normal 2D junction diode structure at various forward voltages.

DETAILED DESCRIPTION OF THE PREFERRED EMBODIMENTS

Figure 2A:
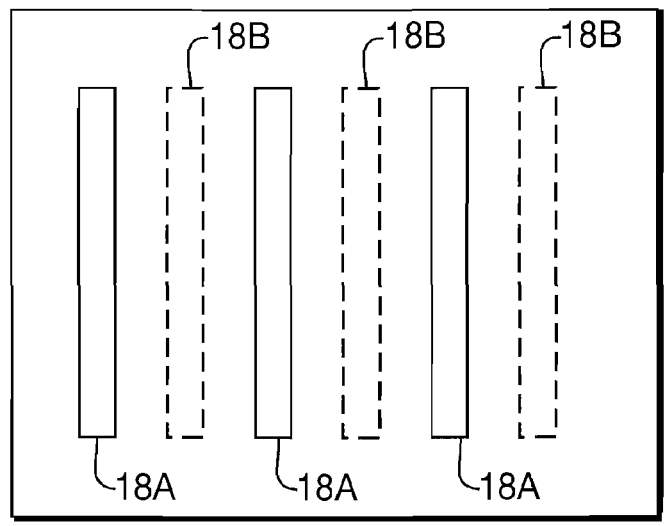
FIG. 2A illustrates a top view of an embodiment of a double trench rectifier structure according to the invention.

FIG. 1A shows one embodiment of the present invention. The diode or rectifier 10 comprises a semiconductor substrate 12 with a first surface 14 and a second surface 16 substantially parallel to the first surface. The semiconductor substrate 12 has a thickness 30 between the first and second surfaces. A variety of semiconductors may be used. These semiconductors may include one or more Group IV elemental semiconductors such as C, Si, or Ge, one or more Groups III-V semiconductors such as GaP, InAs, InP, AlGaAs, InGaAs, or AlGaAsP, or one or more Groups II-VI semiconductors.

A wide variety of current and future semiconductors are, and will be, applicable. Often times several component devices, such as diodes or other components, will be made with a single piece of semiconductor; often referred to as the die. In an illustrative embodiment the semiconductor die may be intrinsic, or may be doped N− or P−.

Figure 2B:
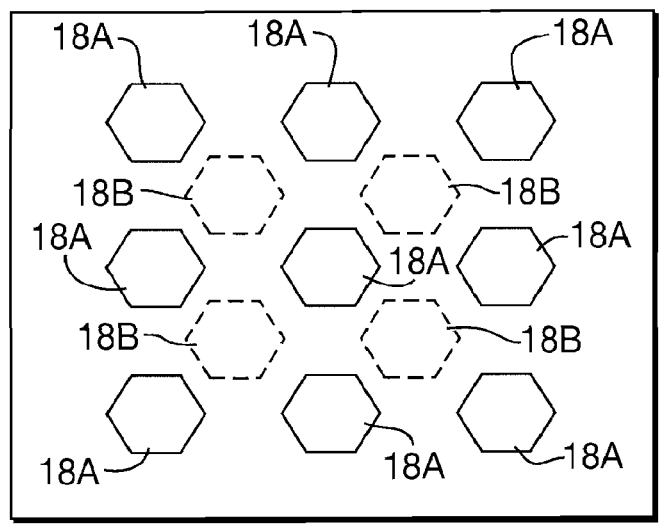
FIG. 2B illustrates a top view of another embodiment of a double trench rectifier structure according to the invention.
Figure 2C:
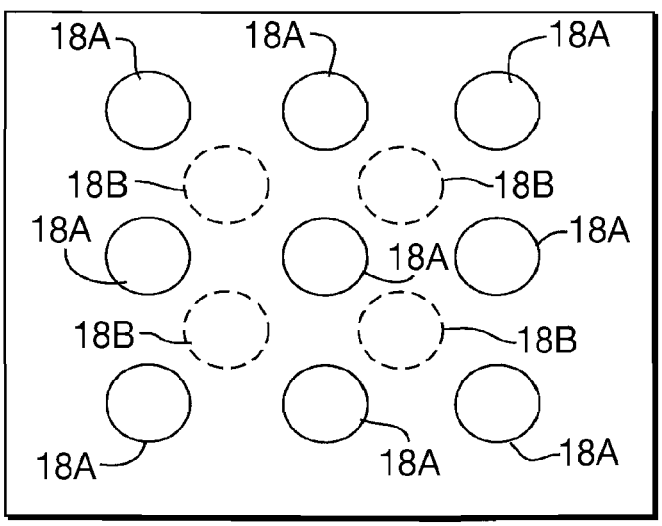
FIG. 2C illustrates a top view of another embodiment of a double trench rectifier structure according to the invention.

The first and second surfaces 14, 16 of the semiconductor substrate 12 have at least one trench 18A, 18B in each surface 14, 16. The diode 10 has an anode that includes at least one trench (e.g., 18A). Similarly, the diode has a cathode that includes at least one trench (e.g., 18B). It is understood that the polarity of the diode may depend on the particular configuration. These trenches 18A, 18B are on opposing surfaces of the substrate. For purposes of this disclosure, the term "trench" refers to substantially vertical depressions perpendicular to the substantially planer surface of the semiconductor substrate as can be seen in FIG. 1A. It is understood that the trench walls can have a variety of profiles and need not be strictly vertical. Similarly, trenches 18A, 18B can have a variety of configurations when viewed from the top. For example FIG. 2A shows a top view of an embodiment having substantially rectangular trench profiles. FIG. 2B shows a top view of an embodiment having hexagonal trench profiles. FIG. 2C shows a top view of an embodiment having circular trench profiles. It is understood that a wide variety of geometric profiles could be used without departing from the scope of the invention including but not limited to circular, oval, elliptical, regular and irregular polygons. It is also understood that combinations of various trench profiles can be included within a single device.

Returning to the example shown in FIG. 1A, the first surface 14 has a first doped region 22 that is at least partially dope P-type. The first doped region includes at least one trench 18A and may be referred to as the anode. The inner surface of the at least one trench 18A on the first surface 14 is at least partially doped P-type to a depth 32 into the substrate 12 (measured perpendicular to the inner surface of the trench 18A). The second surface 16 has a second doped region 24 that is at least partially dope N-type. The second doped region 24 includes at least one trench 18B and may be referred to as the cathode. The inner surface of the at least one trench 18B on the second surface 16 is at least partially doped N-type to a depth 34 into the substrate 12 (measured perpendicular to the inner surface of the trench 18B). The depth of the doping for trenches in the first and second surfaces may be variable. For the purposes of this disclosure, the term "P-type" refers to any degree of P doping which include the range from P+ to P− doping concentrations. The same applies to the term "N-type", however the range will include concentrations from N− to N+.

It is noted that embodiments of the present invention may have one or more trenches 18A, 18B on the first or second surfaces 14, 16. In embodiments where there are more than one trench on either surface 14, 16, the trenches are electrically connected through an at least partially electrically conductive material, which in the case of P-type trenches may be P-type, and in the case of N-type trenches, may be N-type. Other at least partially electrically conductive materials may also be used.

A junction is formed by the first doped region 22 and second doped region 24. As can be seen in FIG. 1, these regions may be separated by a central portion 20 of the substrate 12. The central portion 20 may be intrinsic or may be doped P− or N−. The first and second doped regions 22, 24 can be fabricated using a variety of doping methods. In cases where the trenches are particularly narrow and deep conventional doping techniques may not penetrate into the trenches. In this case, doping can be carried out as follows. For P doped regions a mixture of polysilicon and boron can be deposited by chemical vapor deposition (CVD). For N doped regions a mixture of polysilicon and phosphorous can be deposited by CVD. A wide range of concentrations of polysilicon-boron and polysilicon-phosphorous can be used. However, the concentration should be at least sufficient to form an ohmic contact (e.g., to prevent the formation of a Schottky barrier).

The disclosed trench based, 3 dimensional junction functions as a rectifier because the at least one P-type trench 18A has a higher concentration of positively charged holes than the at least one N-type trench 18B and the substrate 12. Similarly, the at least one N-type trench 18B has a higher concentration of electrons than the at least one P-type trench 18A and the substrate 12. A portion of the holes will diffuse from the relatively high concentration of the at least one P-type trench 18A to the low concentration of the at least one N-type trench 18B and/or the substrate 12. Similarly, a portion of the electrons will diffuse from the relatively high concentration of the at least one N-type trench 18B to the low concentration in the at least one P-type trench 18A and/or the substrate 12. As these electrons and holes, called carriers, diffuse the at least one P-type trench 18A becomes electrically charged negative from the loss of positively charged holes and the at least one N-type trench 18B becomes electrically charged positive from the loss of negatively charged electrons. This charge imbalance induces an electric field that points from the now negatively charged at least one P-type trench 18A to the now positively charged at least one N-type trench 18B. This electric field halts further diffusion and only allows current to pass in the direction of the electric field. In this fashion current can only pass in one direction, thereby acting as a rectifier.

Figure 3:
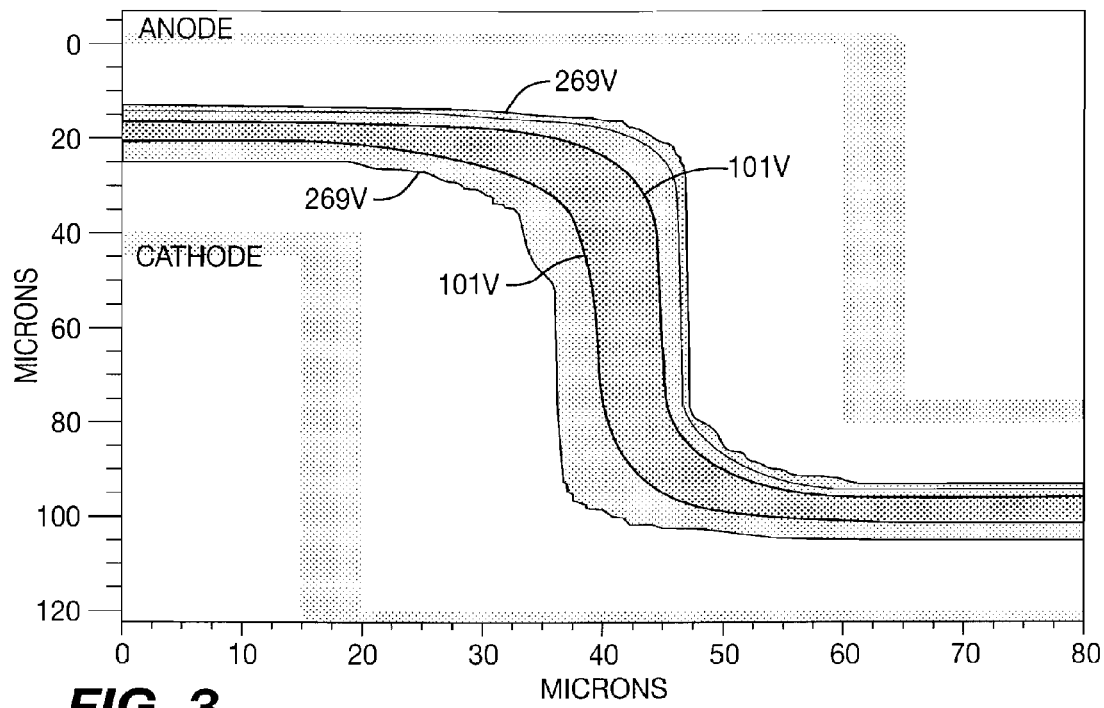
FIG. 3 is a diagram of the potential of the double trench rectifier structure of FIG. 1A.
Figure 4:
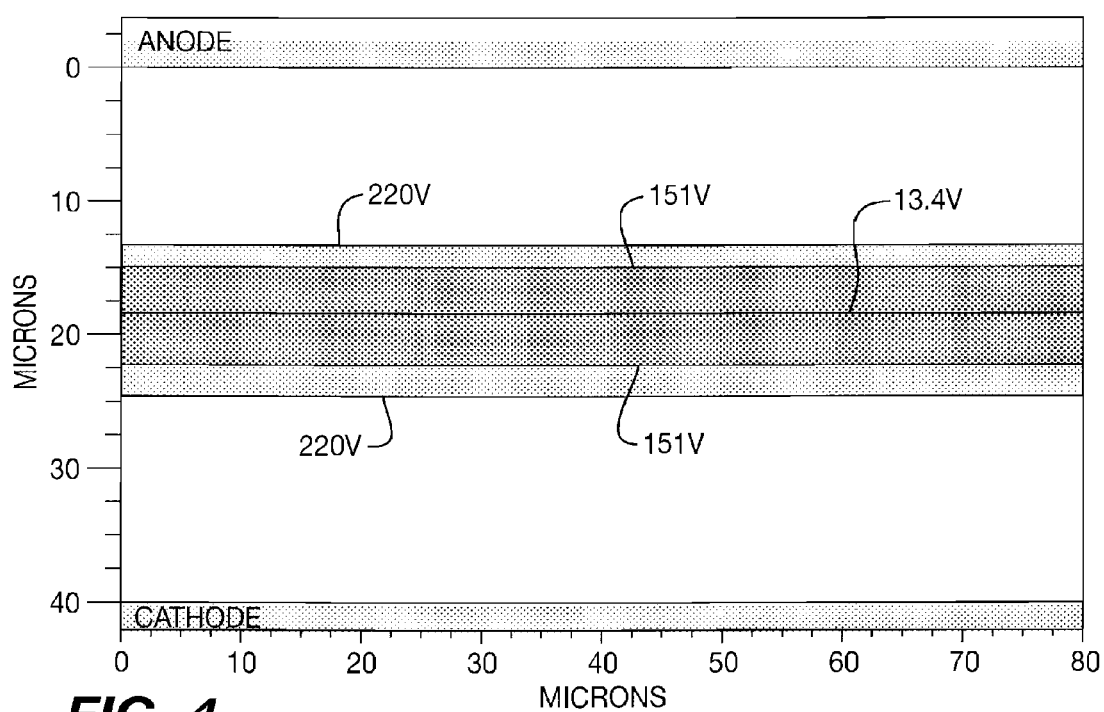
FIG. 4 is a diagram of the potential of a typical diode structure (2D junction).
Figure 5:
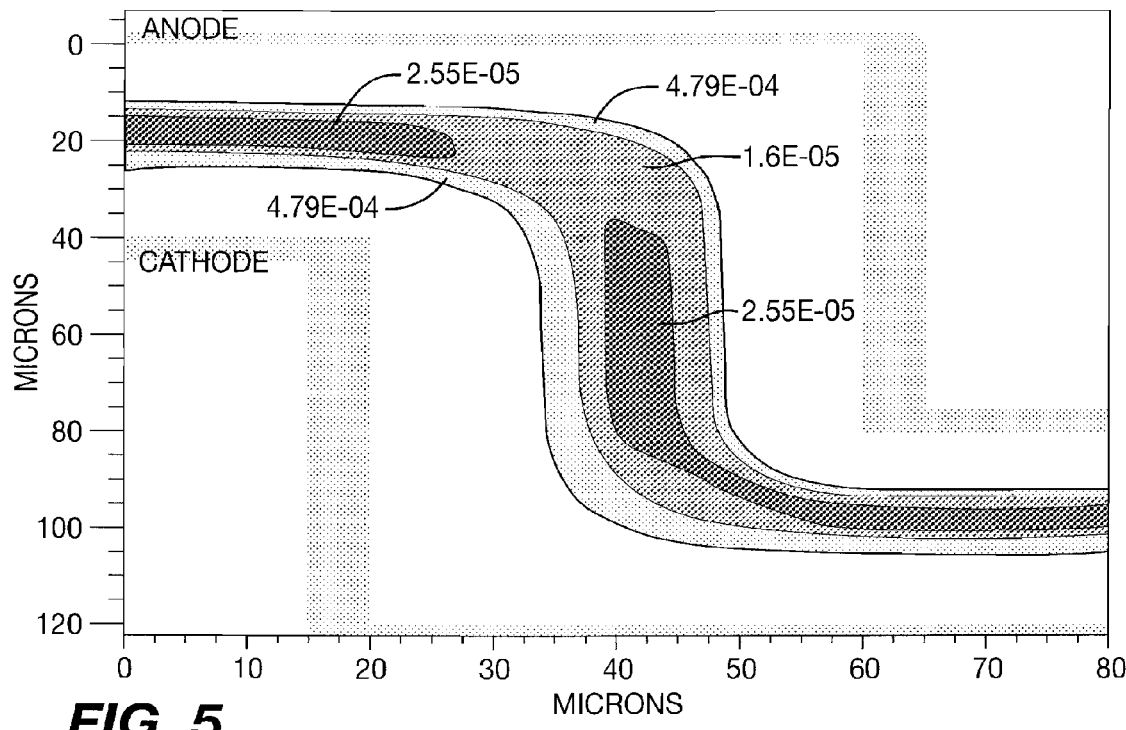
FIG. 5 is a diagram of the electric field of the double trench rectifier structure of FIG. 1A.
Figure 6:
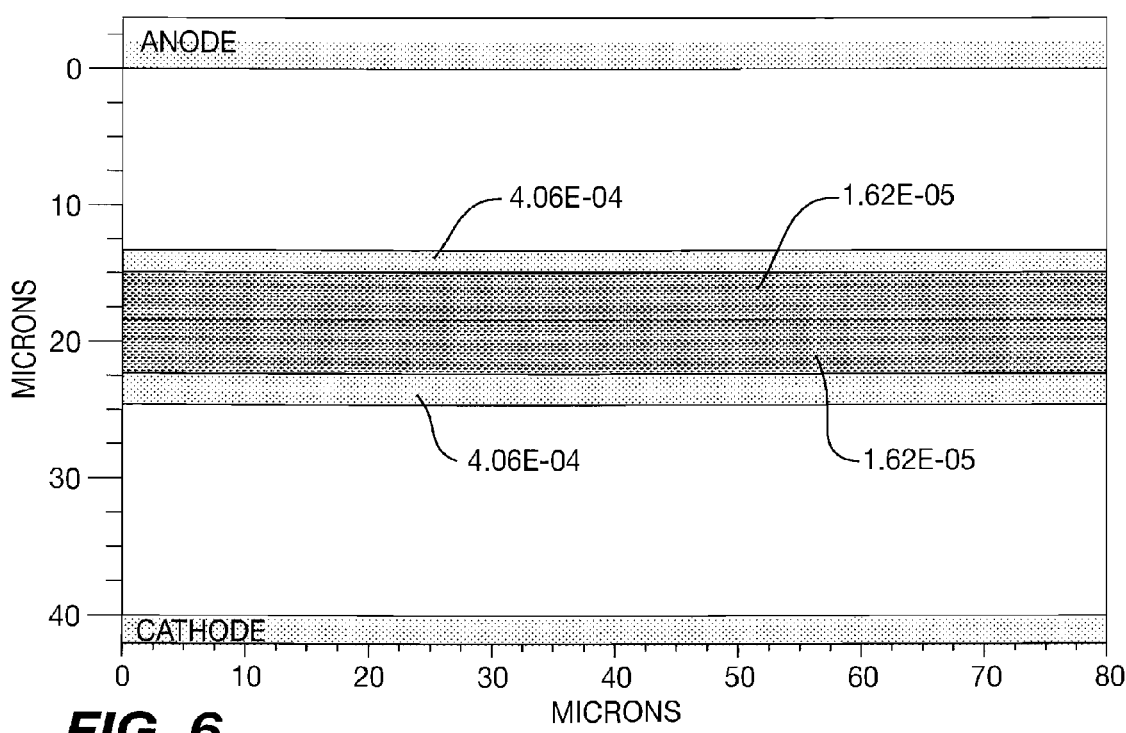
FIG. 6 is a diagram of the electric field of a normal diode structure (2D junction).

FIG. 3 shows an example of calculated electric potential in a double trench diode structure (taken in the vicinity of a single trench 18A) as described above. The electric potential is constant along each line as shown (equipotential lines). FIG. 5 shows an example of calculated electric field magnitudes in the double trench diode structure (again taken in the vicinity of a single trench 18A). In this case, the field magnitude is constant along each line as shown. FIGS. 4 and 6 show respective calculated potentials and electric field for a planar diode (2D junction), without trenches, for comparison with the trench structure shown in FIGS. 3 and 5.

It is understood that graphs of the type shown in FIGS. 3-6 can be drawn with an infinite number of lines or gradients depicting very subtle changes in electric potential or electric field. Such graphs are difficult to digitally scan or photocopy reliably using black and white line drawings or grey scale imagery. For purposes of this disclosure FIGS. 3-6 are shown in simplified form. For example, FIGS. 3 and 5 are shown with only a small sampling of equipotential lines. Similarly, FIGS. 4 and 6 depict only a small selection of electric field areas or zones. It is also understood that FIGS. 3-6 as shown are adequate to illustrate significant differences in electrical characteristics between the disclosed 3D trench structure and a planar diode (2D junction).

FIG. 7 is a table comparing the current densities for a range of forward voltages between a double trench rectifier as disclosed above and a normal 2D junction (planar or GPP). The right column, labeled "Improv Ratio" shows the ratio of the current density of the trench rectifier to that of the normal 2D junction for the same forward voltage.

The embodiments disclosed herein are an improvement over the prior art by utilizing trenches 18A, 18B to create three dimensional junctions which allow for greater current communication and therefore can handle higher current loads. Because the embodiments disclosed herein can handle higher current loads than prior art devices at various voltages, such embodiments can handle the same current load as a prior art device at a lower voltage making it suitable for a low forward voltage rectifier. Further, because the trenches are able to increase the junction surface area without increasing the horizontal space taken up on the semiconductor die, the embodiments disclosed herein are able to increase semiconductor usage by up to 30 percent.

One embodiment comprises a semiconductor substrate, in this case silicon, which has a first surface and a second surface substantially parallel to the first surface with a thickness between the surfaces. This substrate is doped to a concentration in the N− range.

The anode of the rectifier comprises three trenches which are etched into the first surface of the substrate. The inner surfaces of these three trenches are at least partially doped P+ to a depth which runs perpendicular to at least a portion of the inner surface of the trenches. These three trenches are electrically connected. The trenches of the anode may be coated with a metal 26 to create an improved current contact and to help dissipate heat as shown in FIG. 1B.

The cathode of the rectifier comprises two trenches which are etched into the second surface of the substrate substantially across from the three trenches which make up the anode. The inner surfaces of these trenches are at least partially doped N+ to a depth which runs perpendicular to at least a portion of the inner surface of the trenches. These two trenches are electrically connected by N+ doping along the surface of the substrate. The trenches of the cathode may be coated with a metal 28 to create an improved current contact and to help dissipate heat as shown in FIG. 1B.

Those skilled in the art will recognize that a wide variety of modifications, alterations, and combinations can be made with respect to the above described embodiments without departing from the spirit and scope of the invention, and that such modifications, alterations, and combinations are to be viewed as being within the ambit of the inventive concept. It is intended in the appended claims to cover all those changes and modifications which fall within the true spirit and scope of the present invention.

What is claimed is:

1. A trench rectifier comprising: a semiconductor substrate, wherein the substrate has a first surface and a second surface substantially parallel to the first surface; a plurality of first trenches formed in the first surface of the substrate, each of the first trenches having side walls substantially perpendicular to the first surface and a bottom wall substantially parallel to the first surface; a plurality of second trenches formed in the second surface of the substrate, each of the second trenches having side walls substantially perpendicular to the first surface and a bottom wall substantially parallel to the second surface; wherein each of the first trenches comprises a P-type doped region formed in substantially a whole inner surface of each first trench, the P-typed doped regions having a depth adjacent the bottom wall of each of the first trenches extending in a direction perpendicular to the first surface and extending beyond the bottom walls of each of the second trenches; and wherein each of the second trenches comprises an N-type doped region formed in substantially a whole inner surface of each second trench, the N-type doped regions having a depth adjacent the bottom wall of each of the second trenches extending in a direction perpendicular to the second surface and extending beyond the bottom walls of each of the first trenches.

2. The trench rectifier of claim 1, comprising an anode and a cathode, wherein the anode includes the first trenches and the cathode includes the second trenches.

3. The trench rectifier of claim 1, wherein the first trenches are electrically connected by a metal coating.

4. The trench rectifier of claim 1, wherein the second trenches are electrically connected by a metal coating.

5. The trench rectifier of claim 1, wherein the first trenches and the second trenches alternate along a length of the semiconductor substrate.

6. The trench rectifier of claim 1, wherein the first trenches are arranged as spaced latitudinal and longitudinal rows in the first surface of the semiconductor substrate.

7. The trench rectifier of claim 6, wherein the second trenches are arranged as spaced latitudinal and longitudinal rows in the second surface of the semiconductor substrate, the first trenches and the second trenches alternating along the length and width of the semiconductor substrate.

8. The trench rectifier of claim 7, wherein the first trenches are substantially evenly spaced apart along the length and width of the first surface of the semiconductor substrate.

9. The trench rectifier of claim 8, wherein the second trenches are substantially evenly spaced apart along the length and width of the second surface of the semiconductor substrate.

10. The trench rectifier of claim 7, wherein the first trenches are all substantially the same size and shape.

11. The trench rectifier of claim 10, wherein the second trenches are all substantially the same size and shape.

12. A method of forming a trench rectifier, comprising: providing a semiconductor substrate having a first surface and a second surface substantially parallel to the first surface; forming a plurality of first trenches in a first surface of a semiconductor substrate, each of the first trenches having side walls substantially perpendicular to the first surface and a bottom wall substantially parallel to the first surface; forming a plurality of second trenches formed in the second surface of the substrate, each of the second trenches having side walls substantially perpendicular to the first surface and a bottom wall substantially parallel to the second surface; doping substantially a whole inner surfaces of the first trenches P-type to a depth adjacent the bottom wall of each of the first trenches extending in a direction perpendicular to the first surface and extending beyond the bottom walls of each of the second trenches; and doping substantially a whole inner surface of the second trenches N-type to a depth adjacent the bottom wall of each of the second trenches extending in a direction perpendicular to the second surface and extending beyond the bottom walls of each of the first trenches.

13. The method of claim 12, comprising forming an anode and a cathode, wherein the anode includes the first trenches and the cathode includes the second trenches.

14. The method of claim 12, further comprising electrically connecting the first trenches.

15. The method of claim 12, further comprising electrically connecting the second trenches.

16. The method of claim 12, further comprising arranging the first trenches and the second trenches in an alternating pattern along a length of the semiconductor substrate.

17. The method of claim 12, further comprising arranging the first trenches as spaced latitudinal and longitudinal rows in the first surface of the semiconductor substrate.

18. The method of claim 17, further comprising arranging the second trenches as spaced latitudinal and longitudinal rows in the second surface of the semiconductor substrate, wherein the first trenches and the second trenches are arranged in an alternating pattern along the length and width of the semiconductor substrate.

19. The method of claim 18, wherein the first trenches are substantially evenly spaced apart along the length and width of the first surface of the semiconductor substrate.

20. The method of claim 19, wherein the second trenches are substantially evenly spaced apart along the length and width of the second surface of the semiconductor substrate.

21. The trench rectifier of claim 18, wherein the first trenches are all substantially the same size and shape.

22. The trench rectifier of claim 21, wherein the second trenches are all substantially the same size and shape.

\* \* \* \* \*